United States Patent [19]
Koh et al.

[11] Patent Number: 5,717,247
[45] Date of Patent: Feb. 10, 1998

[54] MICROCIRCUIT VIA INTERCONNECT

[75] Inventors: Wei H. Koh, Irvine; Connie S. McCausland, San Juan Capistrano, both of Calif.

[73] Assignee: Grumman Aerospace Corporation, New York, N.Y.

[21] Appl. No.: 751,930

[22] Filed: Nov. 5, 1996

Related U.S. Application Data

[62] Division of Ser. No. 385,113, Feb. 6, 1995, Pat. No. 5,599,744.

[51] Int. Cl.$^6$ ............................................... H01L 23/48
[52] U.S. Cl. ........................ 257/686; 257/700; 257/774
[58] Field of Search ............................ 257/774, 700, 257/686, 713, 690

[56] References Cited

U.S. PATENT DOCUMENTS

| | | | |
|---|---|---|---|
| 3,648,131 | 3/1972 | Stuby | 317/235 R |
| 4,499,655 | 2/1985 | Anthony | 29/580 |
| 4,534,100 | 8/1985 | Lane | 29/586 |
| 4,784,970 | 11/1988 | Solomon | 437/51 |
| 4,794,092 | 12/1988 | Solomon | 437/51 |
| 4,830,878 | 5/1989 | Kaneko et al. | 427/96 |
| 4,907,128 | 3/1990 | Solomon et al. | 361/412 |
| 4,954,458 | 9/1990 | Reid | 437/915 |
| 4,988,641 | 1/1991 | Solomon | 437/83 |
| 4,992,908 | 2/1991 | Solomon | 361/400 |
| 5,010,025 | 4/1991 | Solomon | 437/29 |
| 5,013,687 | 5/1991 | Solomon | 437/209 |
| 5,013,919 | 5/1991 | Solomon | 250/349 |
| 5,030,828 | 7/1991 | Solomon | 250/338.4 |
| 5,036,203 | 7/1991 | Solomon | 250/370.06 |
| 5,045,907 | 9/1991 | Solomon | 357/30 |
| 5,053,350 | 10/1991 | Solomon | 437/47 |
| 5,064,771 | 11/1991 | Solomon | 437/3 |
| 5,067,233 | 11/1991 | Solomon | 29/852 |
| 5,075,201 | 12/1991 | Koh | 430/321 |
| 5,075,238 | 12/1991 | Solomon | 437/3 |
| 5,093,708 | 3/1992 | Solomon | 357/68 |
| 5,108,938 | 4/1992 | Solomon | 437/41 |
| 5,122,851 | 6/1992 | Solomon | 357/30 |
| 5,128,749 | 7/1992 | Hornback et al. | 357/80 |
| 5,135,556 | 8/1992 | Hornback et al. | 65/43 |
| 5,138,164 | 8/1992 | Koh | 250/339 |
| 5,149,671 | 9/1992 | Koh et al. | 437/183 |
| 5,166,097 | 11/1992 | Tanielian | 437/915 |
| 5,198,695 | 3/1993 | Hanes et al. | 257/774 |
| 5,208,478 | 5/1993 | Solomon | 257/443 |
| 5,209,798 | 5/1993 | Solomon et al. | 156/153 |
| 5,231,304 | 7/1993 | Solomon | 257/684 |
| 5,285,570 | 2/1994 | Fulinaran | 29/830 |
| 5,292,624 | 3/1994 | Wei | 430/313 |
| 5,315,147 | 5/1994 | Solomon | 257/448 |
| 5,334,558 | 8/1994 | Dietz et al. | 501/41 |
| 5,365,790 | 11/1994 | Chen et al. | 73/724 |
| 5,393,696 | 2/1995 | Koh et al. | 437/183 |
| 5,399,898 | 3/1995 | Rostoker | 257/499 |
| 5,450,290 | 9/1995 | Boyko et al. | 257/700 |
| 5,496,619 | 3/1996 | Itagaki et al. | 257/700 |
| 5,510,655 | 4/1996 | Tanielian | 257/774 |
| 5,627,406 | 5/1997 | Pace | 257/690 |

FOREIGN PATENT DOCUMENTS

0627874A1  4/1994  European Pat. Off. .

*Primary Examiner*—Sara W. Crane
*Assistant Examiner*—Roy Potter
*Attorney, Agent, or Firm*—Stetina Brunda Garred & Brucker

[57] ABSTRACT

A method for forming a conductive vias in a non-conductive substrate having a through-hole formed therein intermediate two side thereof. The method utilizes the steps of: applying gold paste to the through-hole so as to provide electrical conduction therethrough; and under firing the gold paste when a thin conductive film is present upon the substrate and fully firing the gold paste when no thin conductive film is present on the substrate. Under firing the gold paste when a thin-film is present upon the substrate prevents degradation of the thin conductive film. Subsequent processing of the gold paste assures the integrity and reliability thereof. Thus, the gold paste provides enhanced conductivity and improved reliability, as compared to contemporary thin-film vias.

9 Claims, 3 Drawing Sheets

MICROCIRCUIT VIA INTERCONNECT

This application is a division of application Ser. No. 08/385,113, filed Feb. 6, 1995, now U.S. Pat. No. 5,599,744.

FIELD OF THE INVENTION

The present invention relates generally to integrated circuits and more particularly to a microcircuit via interconnect wherein a conductive via is formed in a non-conductive substrate, the via comprises gold paste disposed within a through-hole formed in the substrate so as to provide electrical conduction therethrough in a manner which enhances conductivity and improves reliability of the conductive via as compared to those utilizing thin or thick films.

BACKGROUND OF THE INVENTION

The infrared spectrum covers a range of wavelengths longer than the visible wavelengths but shorter than microwave wavelengths. Visible wavelengths are generally regarded as between 0.4 and 0.75 micrometers. The near infrared wavelengths extend from 0.75 micrometers to 10 micrometers. The far infrared wavelengths cover the range from approximately 10 micrometers to 1 millimeter. The function of infrared detectors is to respond to energy of a wavelength within some particular portion of the infrared region.

Heated objects dissipate thermal energy having characteristic wavelengths within the infrared spectrum. Different levels of thermal energy, corresponding to different sources of heat, are characterized by the emission of signals within different portions of the infrared frequency spectrum. No single detector is uniformly efficient over the entire infrared frequency spectrum. Thus, detectors are selected in accordance with their sensitivity in the range of interest to the designer. Similarly, electronic circuitry that receives and processes the signals from the infrared detector must also be selected in view of the intended detection function.

A variety of different types of infrared detectors have been proposed in the art since the first crude infrared detector was constructed in the early 1800's. Virtually all contemporary infrared detectors are solid state devices constructed of materials that respond to infrared frequency energy in one of several ways. Thermal detectors respond to infrared frequency energy by absorbing that energy causing an increase in temperature of the detecting material. The increased temperature in turn causes some other property of the material, such as resistivity, to change. By measuring this change the infrared radiation is measured.

Photo-type detectors (e.g., photoconductive and photovoltaic detectors) absorb the infrared frequency energy directly into the electronic structure of the material, inducing an electronic transition which, in turn, leads to either a change in the electrical conductivity (photoconductors) or to the generation of an output voltage across the terminals of the detector (photovoltaic detectors). The precise change that is effected is a function of various factors including the particular detector material selected, the doping density of that material and the detector area.

By the late 1800's, infrared detectors had been developed that could detect the heat from an animal at one quarter of a mile. The introduction of a focusing lenses constructed of materials transparent to infrared frequency energy, as well as advances in semiconductor materials and highly sensitive electronic circuity have advanced the performance of contemporary infrared detectors close to the ideal photon limit.

Current infrared detection systems incorporate arrays of large numbers of discrete, highly sensitive detector elements the outputs of which are connected to sophisticated processing circuitry. By rapidly analyzing the pattern and sequence of detector element excitations, the processing circuitry can identify and monitor sources of infrared radiation. Though the theoretical performance of such systems is satisfactory for many applications, it is difficult to actually construct structures that mate a million or more detector elements and associated circuitry in a reliable and practical manner. Consequently, practical applications for contemporary infrared detection systems have necessitated that further advances be made in areas such as miniaturization of the detector array and accompanying circuitry, minimization of noise intermixed with the electrical signal generated by the detector elements, and improvements in the reliability and economical production of the detector array and accompanying circuitry.

A contemporary subarray of detectors may, for example, contain 256 detectors on a side, or a total off 65,536 detectors, the size of each square detector being approximately 0.0035 inches on a side with 0.0005 inches spacing between detectors. The total width of such a subarray would therefore be 1.024 inches on a side. Thus, interconnection of such a subarray to processing circuitry requires a connective module with Sufficient circuitry to connect each of the 65,536 detectors to processing circuitry within a square a little more than one inch on a side. The subarrays may, in turn, be joined to form an array that includes 25 million detectors or more. Considerable difficulties are presented in aligning the detector elements with conductors on the connecting module and in isolating adjacent conductors in such a dense environment.

The outputs of the detectors must undergo a series of processing steps in order to permit derivation of the desired information. The more fundamental processing steps include preamplification, tuned bandpass filtering, clutter and background rejection, multiplexing and fixed noise pattern suppression. By providing a detector connecting module that performs at least a portion of the signal processing functions within the module, i.e. on integrated circuit chips disposed adjacent the detector focal plane, the signal from each detector need be transmitted only a short distance before processing. As a consequence of such on-focal plane or "up front" signal processing, reductions in size, power and cost of the main processor may be achieved. Moreover, up front signal processing helps alleviate performance, reliability and economic problems associated with the construction of millions of closely spaced conductors connecting each detector element to the main signal processing network.

Various constructions have been proposed to support the necessary connectivity and processing functions of the module. Those constructions have heretofore included the formation of a multi-layer passive substrate having metalized patterns formed thereon. Electronic devices such as integrated circuits are mounted on one or more of the substrate layers and connected to the metalized patterns to communicate signals between the electronic devices and the detector elements or external electronics.

The interconnection of conductive conduits formed upon opposite sides of each layer of such a multi-layer substrate are typically electrically interconnected by the use of conductive vias wherein a thin conductive film is sputter-coated into a through-hole interconnecting each side of the layer or substrate. However, the effectiveness and reliability of such conductive via metal interconnects is substantially limited by the aspect ratio (through-hole opening diameter to depth ratio) of the via and is dependent upon the amount of metal deposited within the via. Typically, the sputter-coated metals deposited within a via are substantially thinner than those formed upon the outside surfaces of the substrate, frequently resulting in ineffective and unreliable electrical interconnection.

Multi-layer Z-modules, as disclosed in U.S. Pat. No. 4,703,170 issued to SCHMITZ on Oct. 27, 1987 and entitled INFRARED FOCAL PLANE MODULE and U.S. Pat. No. 5,093,708 issued to SOLOMON on Mar. 3, 1992 and entitled MULTI-LAYER INTEGRATED CIRCUIT MODULE, the contents of both of which are hereby incorporated by reference, utilize ceramic substrates having two-sided metallization wherein interconnection of the conductive conduits formed upon opposing sides of the substrate is effected with gold thin-film metalized through-holes drilled by a small laser beam with a diameter of less than 50 microns. Sputter-coating is typically applied from both sides of the substrate so as to provide more complete coverage of the metallization layer within the via through-hole.

Since the via through-hole depth, i.e., the thickness of the substrate, is several times greater than the diameter of the via opening, the amount of metal deposited within the via through-hole is typically substantially less than that formed upon the exterior surfaces of the substrate. For example, it has been found that in a 100 micron thick substrate with 40 micron diameter via holes, that a 1 micron thick deposit on the exterior surface typically results in an equivalent thickness of less than 0.1 micron inside the via through-hole.

Subsequent processing of the substrate frequently results in damage to the thin-film metallization layer formed within the via. Such damage occurs due to physical, chemical, and thermal stresses inherent to such subsequent processing. Physical damage may result from foreign materials being undesirably introduced into the via during such processing. Chemical damage may result from the effects of corrosive agents and/or solvents being deposited within the via through-hole during such subsequent processing. Thermal stress is typically inherent to subsequent processing of the substrate wherein various materials are deposited upon the substrate, typically via thermal processes, and wherein various components may be attached to the substrate via thermal bonding. As such, failure of the via interconnection may occur, typically where the metallization layer is thinnest, i.e., proximate the mid-point of the via through-hole.

Even when such via interconnects successfully pass electrical acceptance testing subsequent to such processing, it is possible for the via interconnect to degrade due to the effects of aging and thermal stress, thereby causing blatant failures.

Because of the high cost of multi-layer infrared detector modules employing such via interconnects and because of the inability to effect repairs upon the space-based systems wherein such multi-layered modules are typically utilized, it is desirable to provide via interconnects possessing improved conductivity and long term reliability.

SUMMARY OF THE INVENTION

The present invention specifically addresses and alleviates the above-mentioned deficiencies associated with the prior art. More particularly, the present invention comprises a method for forming a conductive via in a non-conductive substrate having a through-hole formed therein intermediate two sides thereof. The method comprises the steps of: applying gold paste to the through-hole so as to provide electrical conduction therethrough; and under firing the gold paste when a thin conductive film is present upon the substrate or fully firing the gold paste when no thin conductive film is present on the substrate. Thus, if a thick film or no film at all is formed upon the substrate, then the gold paste is fully fired. Under firing the gold paste when a thin-film is present upon the substrate prevents degradation of the thin conductive film. Subsequent processing of the gold paste assures the integrity and reliability thereof. Thus, the gold paste provides enhanced conductivity and improved reliability, as compared to contemporary thin-film vias.

Six different embodiments of the present invention provide effective and reliable vias when either a thin-film, thick-film, or no film at all has previously been applied to a substrate and also provide for the application of the gold paste either as a coating formed within the via or as a filling which plugs the via.

In first and second embodiments of the present invention a thin-film metallization has previously been applied to a substrate. The method for forming a conductive via in a non-conductive substrate according to the first embodiment of the present invention comprises the steps of: applying a conductive material within a through-hole; and firing the conductive material at a temperature below that temperature which results in degradation of the thin conductive film. The thin conductive material preferably comprises thin-print gold paste.

The conductive material is preferably applied by screenprinting, squeegeeing, vacuum sucking, or calendaring. Those skilled in the art will recognize that various other means for applying the conductive material are likewise suitable.

The step of applying the conductive material within the through-hole comprises coating the through-hole with the conductive material. The step of firing the conductive material comprises firing the conductive material at a temperature of less than 500° C. so as to prevent degradation of the thin-film metallization applied to the substrate.

Optionally, a first non-conductive material, preferably low temperature fireable glass paste, is applied to the conductive material so as to form a coating thereon. The first non-conductive material is fired at a temperature below that temperature which results in degradation of the thin conductive film formed upon the substrate, preferably at a temperature of less than approximately 500° C.

The first non-conductive material is preferably applied by screenprinting, squeegeeing, vacuum sucking, or calendaring. Again, those skilled in the art will recognize that various other methods for applying the first non-conductive material are likewise suitable.

Optionally, a second non-conductive material is applied to the first non-conductive material so as to fill or plug the through-hole. The second non-conductive material preferably comprises a low viscosity, liquid epoxy. The second non-conductive material is preferably applied to the first non-conductive material by either wicking or vacuum sucking.

In a second embodiment of the present invention, the step of applying the conductive material within the through-hole comprises substantially filing the through-hole with the conductive material. Since the through-hole is plugged, the first and/or second non-conducting coating are not required.

In third and fourth embodiments of the present invention, a thick-film is formed upon the substrate. In the third embodiment of the present invention, the method for forming a conductive via in a non-conductive substrate comprises the steps of: applying a conductive material within the through-hole and firing the conductive material at a temperature sufficient to effect mature or full firing thereof. Such full firing may be effected since there is no thin-film present to be degraded thereby. As in the first embodiment of the present invention, the conductive material preferably comprises thin-print gold paste and is preferably applied by screenprinting, squeegeeing, vacuum sucking, or calendaring. The conductive material is preferably fired at a temperature of approximately 850° C. The applied conductive material forms a coating upon the thick-film conductive material within the through-hole.

As in the first embodiment of the present invention, a first non-conductive material is optionally applied to the conductive material. The first non-conductive material is preferably fired at a temperature of approximately 850° C. As in the first embodiment of the present invention, a second, non-conductive material is optionally applied to the first non-conductive material so as to fill or plug the through-hole. The second non-conductive material preferably comprises a low viscosity, liquid epoxy. The second non-conductive materials preferably applied to the first non-conductive material either by wicking or vacuum sucking.

In the fourth embodiment of the present invention, the step of applying the conductive material comprises substantially filling the through-hole with conductive material. Again, the first and second non-conductive layers are not required.

In fifth and sixth embodiments of the present invention, no conductive film is initially formed upon the substrate. In the fifth embodiment of the present invention, the method for forming a conductive via in a non-conductive substrate comprises the steps of: applying a conductive material within the through-hole, directly upon the substrate, and then firing the conductive material at a temperature sufficient to effect mature or full firing thereof. Such full firing may be effected since there is no thin-film present to be degraded thereby. As in the first embodiment of the present invention, the conductive material preferably comprises thin-print gold paste and is preferably applied by screenprinting, squeegeeing, vacuum sucking, or calendaring. The conductive material is preferably fired at a temperature of approximately 850° C. The conductive material thus forms a coating directly upon the substrate within the through-hole.

As in the first and second embodiments of the present invention, a first non-conductive material is optionally applied to the conductive material. The first non-conductive material is preferably fired at a temperature of approximately 850° C.

As in the first embodiment of the present invention, a second, non-conductive material is optionally applied to the first non-conductive material so as to fill or plug the through-hole. The second non-conductive material preferably comprises a low viscosity, liquid epoxy. The second non-conductive materials preferably applied to the first non-conductive material either by wicking or vacuum sucking.

In a sixth embodiment of the present invention, the step of applying the conductive material comprises substantially filling the through-hole as in the second and fourth embodiments thereof.

A conductive via formed according to the methodology of the present invention thus comprises a gold coating formed upon either a thin conductive film or a thick conductive film, or formed directly upon the substrate, i.e., not formed upon a conductive film. Alternatively, a gold-filled via is provided wherein the gold filling is applied over either a thin conductive film or a thick conductive film or within a via, directly upon a substrate having no film at all. Where a gold coating is applied, a glass coat may optionally be applied thereover so as to provide protection from degradation to the underlying gold coat. Optionally, an epoxy coating may further be utilized to fill or plug the via so as to prevent fluid flow from one side of the substrate to the other, thereby facilitating simultaneous processing of both sides of the substrate during subsequent integrated circuit formation and also preventing contaminants from being communicated from one side of the substrate to the other during subsequent handling.

The methodology of the present invention may thus be utilized to either render ineffective and less reliable thin-film metalized via interconnects more effective and reliable by providing substantially more conductive material within the via or may alternatively be utilized to form a conductive pathway within a through-hole lacking any such metallization layer formed therein. Thus, the methodology of the present invention may be utilized either to form conductive conduits through vias or to reinforce those conductive conduits, i.e., thin or thick films, already formed therein.

The methodology of the present invention may be practiced at various stages of the thin-film via interconnect process or even after completion of integrated circuit formation upon the substrate so as to effect repair of those via interconnects requiring rework. Thus, the production yield and reliability of the via interconnects so formed is significantly improved as compared to those via interconnects formed by the contemporary thin-film sputtering process.

Furthermore, the present invention facilitates processing of thin-film coated microcircuit layers having reinforced via interconnects at higher temperatures than those previously suitable for sputter deposited gold thin-film via interconnects.

Furthermore, the electrical resistance of via interconnects formed according to the present invention is reduced by an order of magnitude, typically from approximately 0.5–1.0 ohm for sputter coated vias to less than 50–100 milliohm in vias processed according to the process of the present invention, depending upon the through-hole aspect ratio.

DETAILED DESCRIPTION OF THE PREFERRED EMBODIMENT

The detailed description set forth below in connection with the appended drawings is intended as a description of the presently preferred embodiments of the invention, and is not intended to represent the only forms in which the present invention may be constructed or utilized. The description sets forth the functions and sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

The microcircuit via interconnects of the present invention are illustrated in FIGS. 1–6 which depict six presently preferred embodiments of the invention. FIG. 7 is a flowchart illustrating the steps comprising the processes for forming the six embodiments of the present invention.

Figure 1:
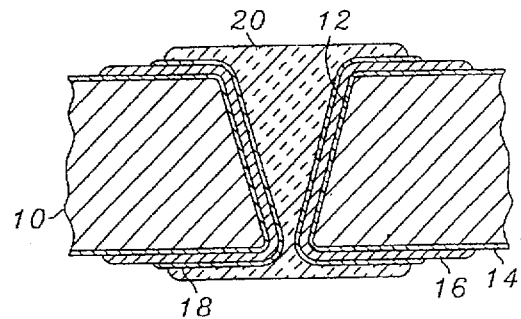
FIG. 1 is a fragmentary cross-sectional side view of a first embodiment of the present invention wherein a gold coat is applied over a thin conductive film and an optional non-conductive glass coat and an optional epoxy fill are applied over the gold coat.

Referring now to FIG. 1, the first embodiment of the microcircuit via interconnect of the present invention comprises a substrate 10 having a via through-hole 12 formed therethrough. The via through-hole 12 is typically formed via laser drilling and thus typically has a larger opening at one end, i.e., the top, than at the other end, i.e., the bottom, thereof.

In the first embodiment of the microcircuit via interconnect of the present invention, a thin-film conductive layer 14 is formed upon the substrate 10 and within the via through-hole 12. A gold coat 16 is formed upon the thin conductive film 14.

Optionally, a glass coat 18 is formed upon the gold coat 16. Optionally, an epoxy fill or plug 20 seals the via through-hole 12.

Figure 2:
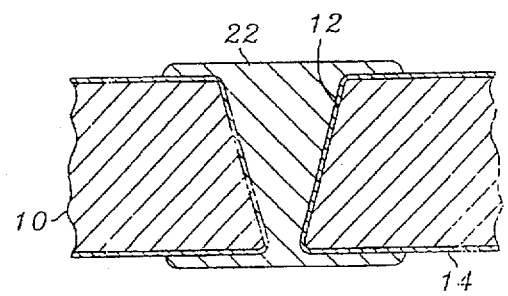
FIG. 2 is a fragmentary cross-sectional side view of a second embodiment of the present invention wherein a gold plug is formed within the via through-hole over a thin conductive film.

Referring now to FIG. 2, in the second embodiment of the microcircuit via interconnect of the present invention, a thin conductive film 14 is formed upon the substrate 10 and within the via through-hole 12 as in the first embodiment of the present invention. In the second embodiment of the present invention, a gold fill plug 22 seals the via through-hole 12.

Figure 3:
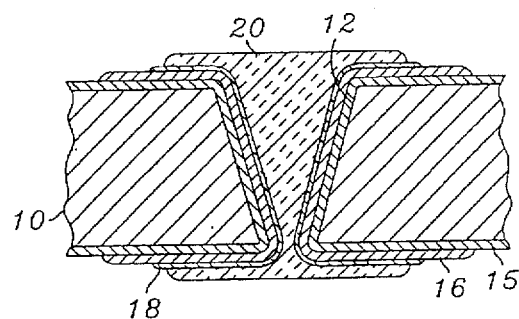
FIG. 3 is a fragmentary cross-sectional side view of a third embodiment of the present invention wherein a gold coat is applied over a thick conductive film and an optional non-conductive glass coat and an optional epoxy fill are applied over the gold coat.

Referring now to FIG. 3, in a third embodiment of the microcircuit via interconnect of the present invention, a thick conductive film 15 is formed upon the substrate 10 and within the via through-hole 12. As in the first embodiment of the present invention, a gold coat 16 is formed upon the thick conductive film 15. An optional glass coat 18 is applied over the gold coat 16 and an optional glass fill plug 20 seals the via through-hole 12.

Figure 4:
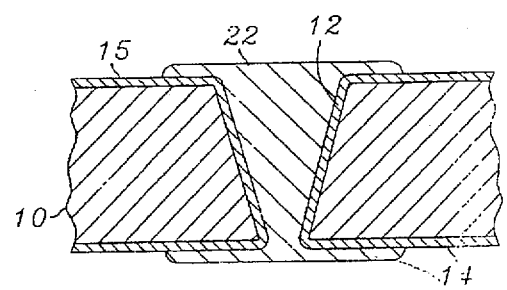
FIG. 4 is a fragmentary cross-sectional side view of a fourth embodiment of the present invention wherein a gold plug is formed within the via through-hole over a thick conductive film.

Referring now to FIG. 4, in a fourth embodiment of the microcircuit via interconnect of the present invention a thick conductive film 15 is formed upon the substrate 10 and within the via through-hole 12 as in the third embodiment of the present invention. In a manner similar to that of the second embodiment of the present invention, a gold fill plug 22 seals the via through-hole 12.

Figure 5:
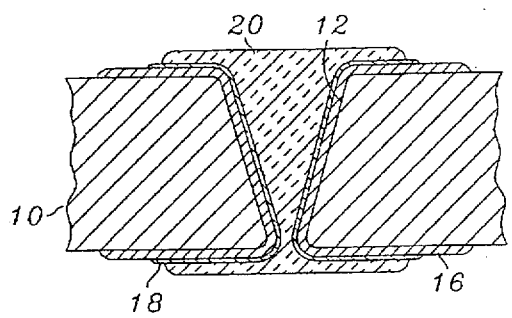
FIG. 5 is a fragmentary cross-sectional side view of a fifth embodiment of the present invention wherein a gold coat is applied directly upon the substrate and an optional non-conductive glass coat and an optional epoxy fill are applied over the gold coat.

Referring now to FIG. 5, in a fifth embodiment of the microcircuit via interconnect of the present invention, no conductive film is formed upon the substrate 10 or within the via through-hole 12. A gold coat 16 is therefore applied directly to the substrate 10 within the via through-hole 12.

As in the first and third embodiments of the present invention, an optional glass coat 18 is formed over the gold coat 16 and an optional epoxy fill plug 20 seals the via through-hole.

Figure 6:
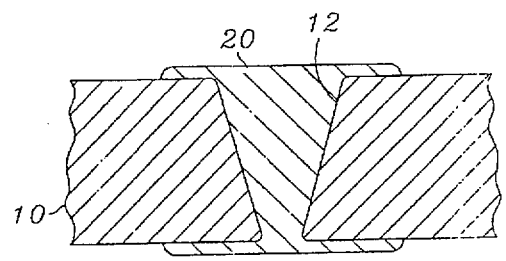
FIG. 6 is a fragmentary cross-sectional side view of a sixth embodiment of the present invention wherein a gold plug is formed directly upon the substrate within the via through-hole.
Figure 7A:
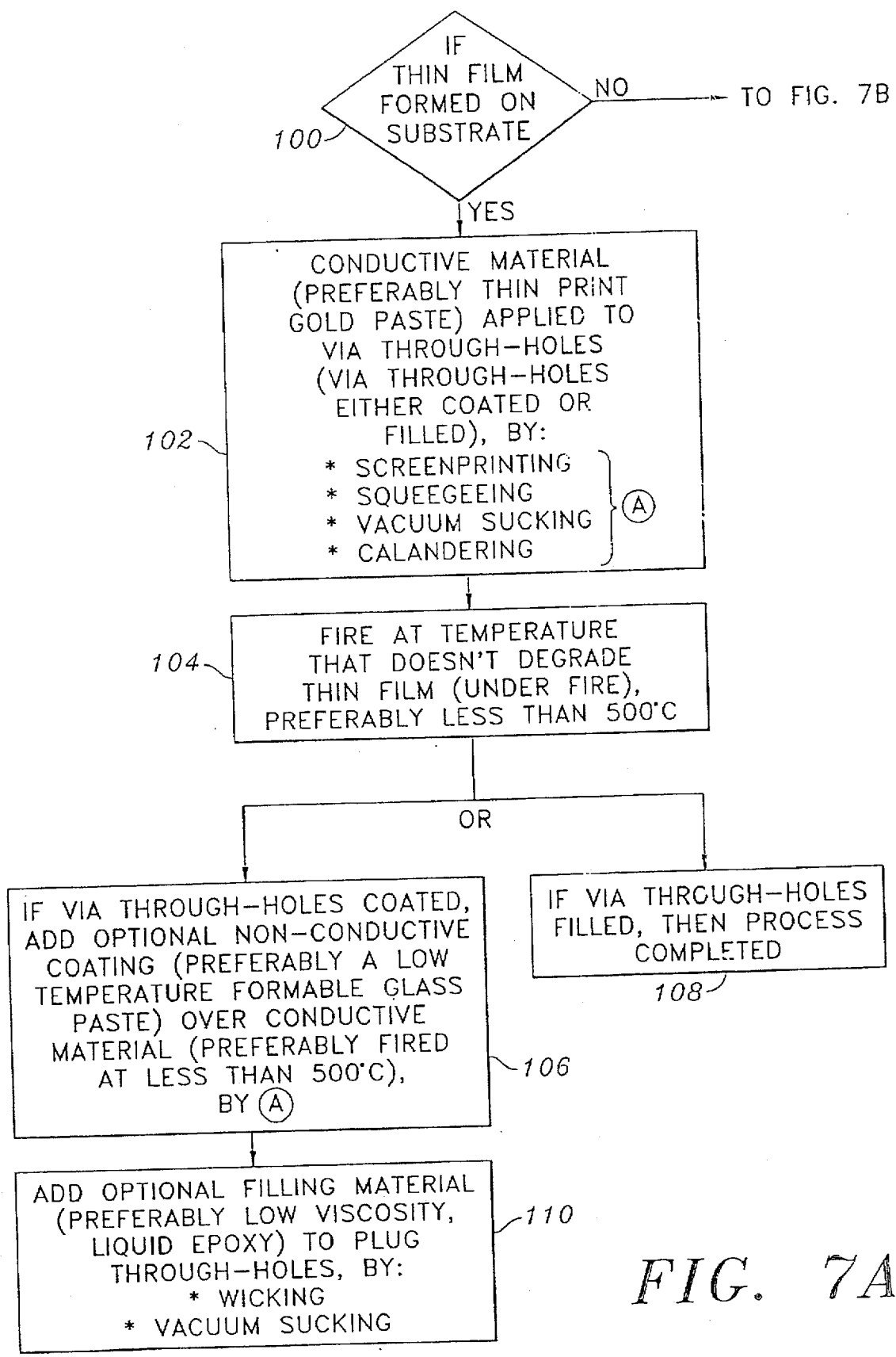
FIG. 7 is a flowchart illustrating the steps of the different processes for forming the six embodiments of the present invention.
Figure 7B:
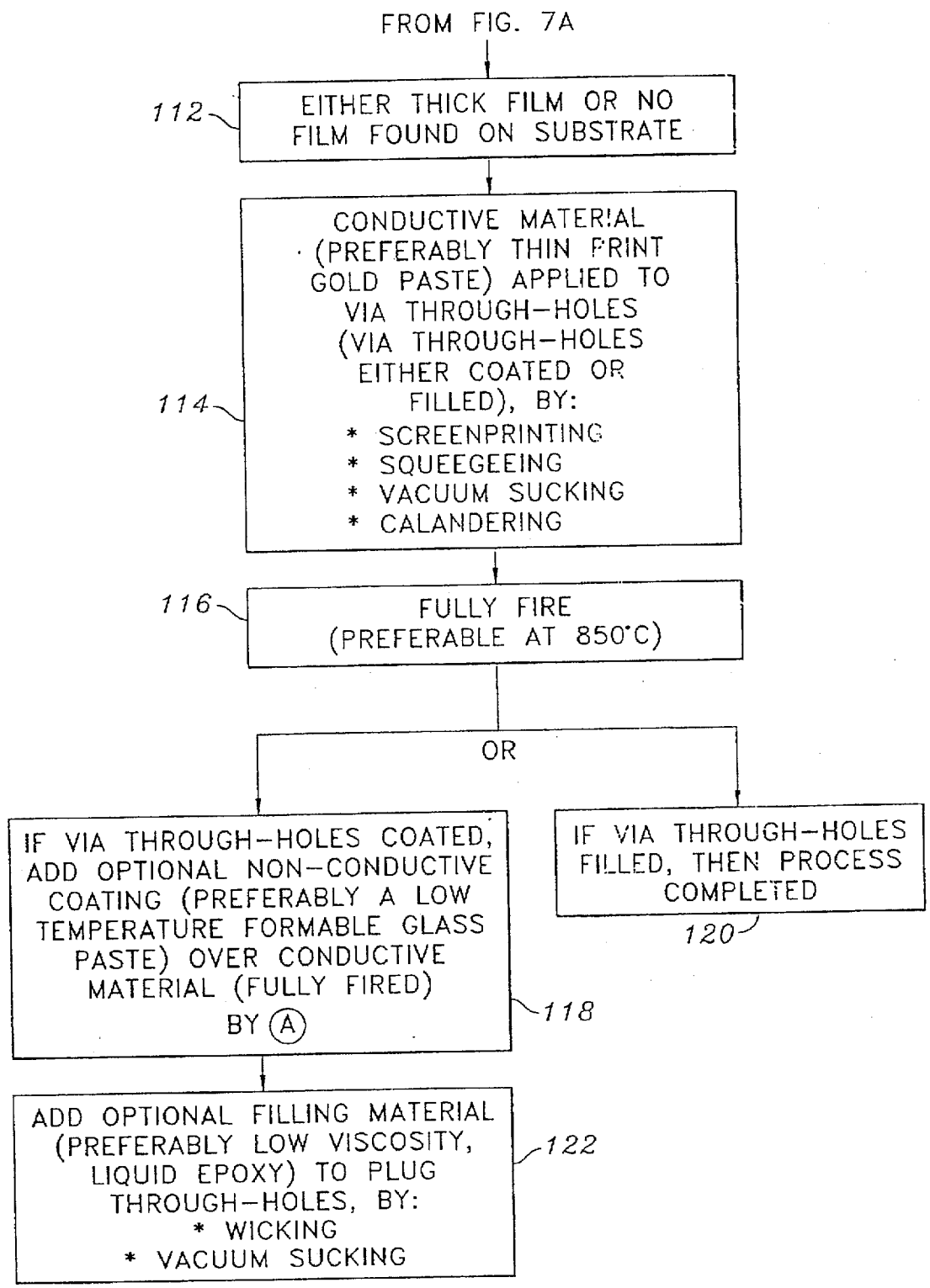

Referring now to FIG. 6, in a sixth embodiment of the microcircuit via interconnect of the present invention, no conductive film is formed upon the substrate 10 or within the via through-hole 12, as in the fifth embodiment of the present invention. A gold fill plug 20 seals the via through-hole 12 as in the second and fourth embodiments of the present invention.

Referring now to FIG. 7, according to the methodology of the present invention, a process is provided for forming microcircuit via interconnects wherein a conductive via is formed in a non-conductive substrate, the via comprises gold paste disposed within a through-hole formed in the substrate so as to enhance electrical conduction therethrough in a manner which improves the reliability of the conductive via as compared to those merely utilizing thin or thick films.

If a thin film is formed on the substrate (step 100), then conductive material, preferably thin-print gold paste, is applied to via through-holes preferably by either screenprinting, squeegeeing, vacuumsucking, or calendaring (step 102). In the first embodiment of the present invention, the via through-holes are coated and in the second embodiment of the present invention, the via through-holes are filled.

The substrate is then fired at a temperature that does not degrade the thin films, i.e., the substrate is underfired, preferably at a temperature of less than 500° C. (step 104).

If the via through-holes were coated, then an optional non-conductive coating, preferably a low temperature fireable glass paste, is added over the conductive gold coat, and fired at a temperature preferably less than 500° C. The non-conductive coating is preferably applied by screenprinting, squeegeeing, vacuumsucking, or calendaring (step 106). A filling material, preferably low viscosity liquid epoxy, is optionally added to plug the through-hole. The filling material is preferably applied by either wicking or vacuum sucking (step 110).

If the via through-holes were filled, then the second embodiment of the present invention is provided and the process is complete (step 108).

If a thin film is not formed upon the substrate (step 100) then, either a thick film or no film at all is formed upon the substrate (step 112). In either case, conductive material, preferably thin-print gold paste, is applied to the via through-holes. The via through-holes may either be coated or filled, preferably by screenprinting, squeegeeing, vacuum sucking, or calendaring (step 114). The substrate is then fully fired, preferably at a temperature of approximately 850° C. (step 116). If the via through-holes were coated, then an optional non-conductive coating, preferably a low temperature fireable glass paste, is optionally applied over the conductive gold coating and the substrate is fully fired. The non-conductive coating is preferably applied by either screenprinting, squeegeeing, vacuum sucking, or calendaring (step 118). An optional filling material, preferably low viscosity, liquid epoxy, may be added to plug the through-holes, preferably via wicking or vacuum sucking (step 122). If a thick film was formed upon the substrate, then the third embodiment of the present invention is provided and if no film was formed upon the substrate, then the fifth embodiment of the present invention is provided.

If the via through-holes were filled, then the process is completed (step 120). The fourth embodiment of the present invention is provided if a thick conductive film was formed upon the substrate or the sixth embodiment is provided if no film was provided upon the substrate.

It is understood that the exemplary microcircuit via interconnects described herein and shown in the drawings represent only presently preferred embodiments of the invention. Indeed, various modifications and additions may be made to such embodiments without departing from the spirit and scope of the invention. For example, those skilled in the art will recognize that various other conductive and non-conductive materials may be utilized. Also, various types of substrates and methods for drilling vias therethrough are contemplated. Thus, these and other modifications and additions may be obvious to those skilled in the art and may be implemented to adapt the present invention for use in a variety of different applications.

What is claimed is:

1. A conductive via formed in a non-conductive substrate, said conductive via comprising:
   a) a through-hole formed intermediate two sides of the substrate;
   b) a thin conductive film composed of thin-print gold paste formed within the through-hole; and
   c) a coating of conductive material formed upon said thin conductive film, said coating of conductive material being under fired such that said thin film is not degraded thereby;
   d) wherein said coating of conductive material enhances the conductive via's conductivity and improves its reliability.

2. A conductive via formed in a non-conductive substrate, said conductive via comprising:
   a) a through-hole formed intermediate two sides of the substrate;
   b) a thick conductive film composed of thin-print gold paste formed within the through-hole; and
   c) a coating of conductive material formed upon said thick conductive film, said coating of conductive material being fully fired;
   d) wherein said coating of conductive material enhances the conductive via's conductivity and improves its reliability.

3. A conductive via formed in a non-conductive substrate, said conductive via comprising:
   a) a through-hole formed intermediate two sides of the substrate; and
   b) a coating of conductive material composed of thin-print gold paste formed within said through-hole, said coating of conductive material being fully fired;
   c) wherein said coating of conductive material provides enhanced conductivity and reliability as compared to thin-film vias.

4. A conductive via formed in a non-conductive substrate, said conductive via comprising:
   a) a through-hole formed intermediate two sides of the substrate;
   b) a thin conductive film formed within the through-hole;
   c) a coating of conductive material formed upon said thin conductive film, said coating of conductive material being under fired such that said thin film is not degraded thereby;
   d) wherein said coating of conductive material enhances the conductive via's conductivity and improves its reliability; and
   e) a glass coating formed over said coating of conductive material.

5. The conductive via as recited in claim 4 further comprising epoxy formed over said glass coating so as to plug said through-hole.

6. A conductive via formed in a non-conductive substrate, said conductive via comprising:
   a) a through-hole formed intermediate two sides of the substrate;
   b) a thick conductive film formed within the through-hole;
   c) a coating of conductive material formed upon said thick conductive film, said coating of conductive material being fully fired;
   d) wherein said coating of conductive material enhances the conductive via's conductivity and improves its reliability; and
   e) a glass coating formed over said coating of conductive material.

7. The conductive via as recited in claim 6 further comprising epoxy formed over said glass coating so as to plug said through-hole.

8. A conductive via formed in a non-conductive substrate, said conductive via comprising:
   a) a through-hole formed intermediate two sides of the substrate;
   b) a coating of conductive material formed within said through-hole, said coating of conductive material being fully fired;
   c) wherein said coating of conductive material provides enhanced conductivity and reliability as compared to thin-film vias; and
   d) a glass coating formed over said coating of conductive material.

9. The conductive via as recited in claim 8 further comprising epoxy formed over said glass coating so as to plug said through-hole.

* * * * *